United States Patent [19]
Boles et al.

[11] Patent Number: 6,014,064
[45] Date of Patent: *Jan. 11, 2000

[54] HETEROLITHIC VOLTAGE CONTROLLED OSCILLATOR

[75] Inventors: Timothy E. Boles, Tyngsboro; Joel L. Goodrich, Westford; Paulette R. Noonan, Dracut; Brian Rizzi, N. Chelmsford, all of Mass.

[73] Assignee: The Whitaker Corporation, Wilmington, Del.

[*] Notice: This patent issued on a continued prosecution application filed under 37 CFR 1.53(d), and is subject to the twenty year patent term provisions of 35 U.S.C. 154(a)(2).

[21] Appl. No.: 08/890,534

[22] Filed: Jul. 9, 1997

Related U.S. Application Data

[60] Provisional application No. 60/022,677, Jul. 28, 1996.

[51] Int. Cl.⁷ .......................... H01L 23/522; H01L 23/66; H01L 21/762; H01L 27/02
[52] U.S. Cl. ...................... 331/108 C; 257/655; 257/275; 257/276; 331/107 R; 331/177 V; 438/122
[58] Field of Search ............................ 331/108 C, 107 R, 331/107 G, 177 V; 257/655, 275, 276, 626, 644, 650; 438/122

[56] References Cited

U.S. PATENT DOCUMENTS

| | | | |
|---|---|---|---|
| 4,150,344 | 4/1979 | Fenk | 331/117 |
| 4,210,923 | 7/1980 | North et al. | 357/30 |
| 4,214,252 | 7/1980 | Goerth | 331/177 V X |
| 4,249,262 | 2/1981 | Fenk | 455/333 |
| 4,481,487 | 11/1984 | Brehm et al. | 331/117 |
| 4,789,887 | 12/1988 | Crossley et al. | |
| 4,970,578 | 11/1990 | Tong et al. | 357/81 |
| 4,982,269 | 1/1991 | Calligaro | 357/56 |
| 5,102,822 | 4/1992 | Calligaro | 437/67 |
| 5,268,310 | 12/1993 | Goodrich et al. | 437/15 |
| 5,280,194 | 1/1994 | Richards et al. | 257/724 |
| 5,343,070 | 8/1994 | Goodrich et al. | 257/594 |
| 5,378,926 | 1/1995 | Chi et al. | 257/767 |
| 5,381,033 | 1/1995 | Matsuzaki | 257/499 |
| 5,696,466 | 12/1997 | Li | 330/286 |

FOREIGN PATENT DOCUMENTS

| | | | |
|---|---|---|---|
| 0 534 271 A2 | 3/1993 | European Pat. Off. | H01L 21/331 |
| 0 592 002 A2 | 4/1994 | European Pat. Off. | H01L 23/482 |
| 0 592 002 A3 | 4/1994 | European Pat. Off. | H01L 23/66 |
| WO 97/35340 | 9/1997 | WIPO . | |

OTHER PUBLICATIONS

Glass Microwave IC Packaging Technology, Presented by Richard Perko, M/A–COM Inc. Publication Date Oct. 5, 1994, Electro International 1994, Hynes Convention Center, Boston, MA, May 10–12, 1994, pp. 857–862.

A New Technology For Si Microwave Power Transistor Manufacturing, Ping Li, Corp. R&D Center, M/A–COM Inc., Lowell, MA 01853, Timothy Boles, Burlington Semiconductor Operation, M/A0COM Inc, Burlington, MA 01803, XP–002053834, p. 106.

U.S. Patent Application No. 08/845,726, Docket No. 16595, Heterolithic Microwave Integrated Circuits, Filed Apr. 25, 1997.

U.S. Patent Application No. 08/845,726, Docket No. 16595, Heterolithic Microwave Integrated Circuits, Filed Apr. 25, 1997.

U.S. Patent Application No. 08/845,727, Docket No. 16573, A Method of Fabricating Silicon Based Integrated Circuits, Filed Apr. 25, 1997.

*Primary Examiner*—Arnold Kinkead

[57] ABSTRACT

A voltage controlled oscillator includes a varactor (201) and a transistor (202) and a ground via (203), of epitaxially grown silicon that is etched to provide respective pedestals embodying the varactor (201) and the transistor (202) and the ground via (203), an L-C resonator circuit, the varactor (201) and an inductor providing a tank circuit that changes the frequency of the L-C resonator circuit, and that shifts the average frequency of the oscillator to that of an input voltage to the collector of the transistor (202).

3 Claims, 2 Drawing Sheets

HETEROLITHIC VOLTAGE CONTROLLED OSCILLATOR

This application claims benefit of provisional application Ser. No. 60/022,677, filed Jul. 28, 1996.

FIELD OF THE INVENTION

The present invention relates to a fully monolithic voltage controlled oscillator for applications at rf frequencies.

BACKGROUND OF THE INVENTION

A voltage controlled oscillator (VCO) is simply an oscillator having a frequency output that is proportional to an applied voltage. While VCO's have many applications in a variety of electronic circuits, one particular application focused upon in the present disclosure is in communications systems in phase locked loops (PLL). A simple block diagram of a phase lock loop is as shown in FIG. 1. The basic elements of the system are a phase comparator, a loop filter, an amplifier and the voltage control oscillator. When the loop is in what is known as a locked condition on an incoming periodic signal, the VCO frequency is exactly equal to that of the incoming frequency. The phase detector produces a dc or low-frequency voltage which is proportional to the phase difference between the incoming signal and the VCO output signal. This phase sensitive signal is then passed through the loop filter and amplifier, where upon it is amplified to control the input of the VCO and the feedback loop. If, for example, the frequency of the incoming signal shifts slightly, the phase difference between the VCO signal and the incoming signal will begin to increase in time. This change in the control voltage on the VCO will effect a change to bring the VCO frequency back to the same value as the incoming frequency. Through this ongoing capturing process, the loop can maintain a lock on the input frequency changes, and the VCO input voltage is proportional to the frequency of the incoming signal. This behavior makes phase lock loop particularly useful in demodulation of FM signals, where the frequency of the incoming signals vary in time by definition and further contain the desired data or other information.

The range of input frequency over which a loop can maintain lock is known as the lock range. In an unlocked condition, the phase detector can be as simple as a multiplier-phase detector containing the sum and difference frequency components. The sum frequency component is generally filtered out by the loop filter, and the output of the low pass filter is then a sinusoid with a frequency that is equal to the difference between the VCO free running frequency and the incoming signal frequency. Application of this different frequency to the VCO input causes the VCO frequency itself to become a sinusoidal function of time. Because the VCO frequency is varying as a function of time, it will alternately move closer and farther away in frequency from that of the incoming signal frequency. The output of the phase detector is a near sinusoid with a frequency that is the difference between the VCO frequency and the input frequency. When the VCO frequency moves away from the incoming frequency, the sinusoid moves to a higher frequency. When the VCO frequency moves closer to the incoming frequency the sinusoid moves to a lower frequency. The result is that the frequency of the sinusoid different-frequency waveform is reduced when the incremental amplitude is negative and increased when the amplitude is positive. This causes the phase detector output to have an asymmetric waveform during capture. This asymmetric waveform introduces a dc component in the phase detector output that shifts the average VCO frequency towards the incoming signal frequency, so that the difference frequency gradually decreases. In this inherently non-linear process, the result is that the system becomes locked and the difference frequency becomes zero with a resultant dc voltage remaining at the loop filter output. This is known as the capture process and is a fundamental portion of a phase lock loop and the key function of the voltage controlled oscillator in a phase lock loop. Finally, the VCO is a critical element in PLL's as the VCO determines operating frequency range, FM distortion and center-frequency drift.

In conventional voltage controlled oscillators, discrete elements are generally used and mounted on an rf board. Thereafter, solder and wirebonds are used to effect the necessary interconnections between the elements, both passive and active, which are mounted on the rf board. This hybrid structure is generally relatively large in size as well as expensive. The cost of fabrication of the conventional hybrid VCO is becoming unacceptable for the wireless industry. To this end, the rf boards having the VCO with discrete elements are generally fabricated one at a time requiring high frequency interconnections as well as transformations. Additionally, impedance matching is often required and can be painstakingly tedious due to the various and sundry elements, for example solder paths and wire bonds.

Accordingly, what is needed is a voltage controlled oscillator having the required performance characteristics for high frequency applications at a substantially lower cost. The attendant disadvantages of discrete element VCO manufacture must be addressed and an integrated circuit VCO which is readily adaptable to large scale, wafer scale manufacture must be employed.

SUMMARY OF THE INVENTION

The present invention relates to a voltage controlled oscillator manufactured at the wafer scale level. The fabrication at large scale, 8000 to 10000 pieces at a time manufactured with an automatic probe results in a device which has the desired high performance and is manufactured at substantially reduced cost.

While the variety of voltage controlled oscillators used for different applications may vary in circuit design, all require a tuning varactor, preferably a hyper-abrupt junction device, a transistor and passive elements for example, inductors, capacitors and resistors all disposed in a high frequency waveguide structure. The present invention uses a glass based technology as is described in U.S. Pat. Nos. 5,268,310 and 5,343,070 to Goodrich et al., as well as U.S. patent application Ser. No. 08/845,726 filed Apr. 25, 1997 to Boles et al, in its place; disclosures of which are specifically incorporated herein by reference. In a voltage control oscillator, a pn junction device having a transition region capacitance which is dependent upon applied voltage is used. This device, a varactor diode, is used for tuning purposes in the VCO. To this end, the variable capacitance of the varactor is connected to an inductor element to form a tank circuit. The varactor changes the value of C in the tank circuit, thus changing the resonant frequency. Thus the resonant frequency of the VCO changes with a change in the input voltage to the VCO. Standard VCO's are often simple r-c multivibrators with the varactor as well as at least one transistor for switching and bias purposes. The present invention envisions the fabrication of the varactor and the VCO in a single process step, thereby further reducing the complexity of fabrication with a direct impact on a reduction in cost.

In the fabrication of the device of the present invention, a silicon wafer forms the substrate for the device. This wafer is doped no through standard doping techniques, and thereafter, an epitaxial layer is selectively formed to effect the varactor and transistor of the present invention. This epitaxial growth step is effected in a single step to form the bipolar transistor and the hyper-abrupt tuning varactor. Ion implantation is thereafter performed to fabricate the selected pregions on the n epitaxial layer. Thereafter, the wafer and epitaxial layers thereon are selectively etched through a standard wet etch process which is well known in the art. Thereafter, the resultant mesas of the varactor, bipolar transistor and any necessary ground vias have disposed therein a suitable dielectric material having a low loss material at high frequency which is mechanically expansion matched to silicon for isolation of the pedestals or mesas as well as for the dielectric material for the circuit and waveguides. Finally, the resultant VCO has a greater Q factor and better performance at 3 volts due to the hyper-abrupt varactor with relatively steep C-V curves. This latter affect is a result of the epitaxial growth step and implant step chosen.

As can be appreciated, the present invention enables large scale fabrication of voltage controlled oscillators for high frequency application which are low in cost as well as small in size as is required in many applications in the wireless industry.

OBJECTS, FEATURES, AND ADVANTAGES

It is an object of the present invention to have a voltage controlled oscillator fabricated in a heterolithic structure having selectively disposed active devices, dielectric material in circuit elements therein.

It is a feature of the present invention to have a varactor, a bipolar junction transistor and vias formed on a single wafer, the varactor and bipolar junction transistor fabricated using a single epitaxial layer.

It is an advantage of the present invention to have a voltage controlled oscillator fabricated at a substantially reduced cost while maintaining the desired performance characteristics.

DETAILED DESCRIPTION OF THE INVENTION

Figure 3:
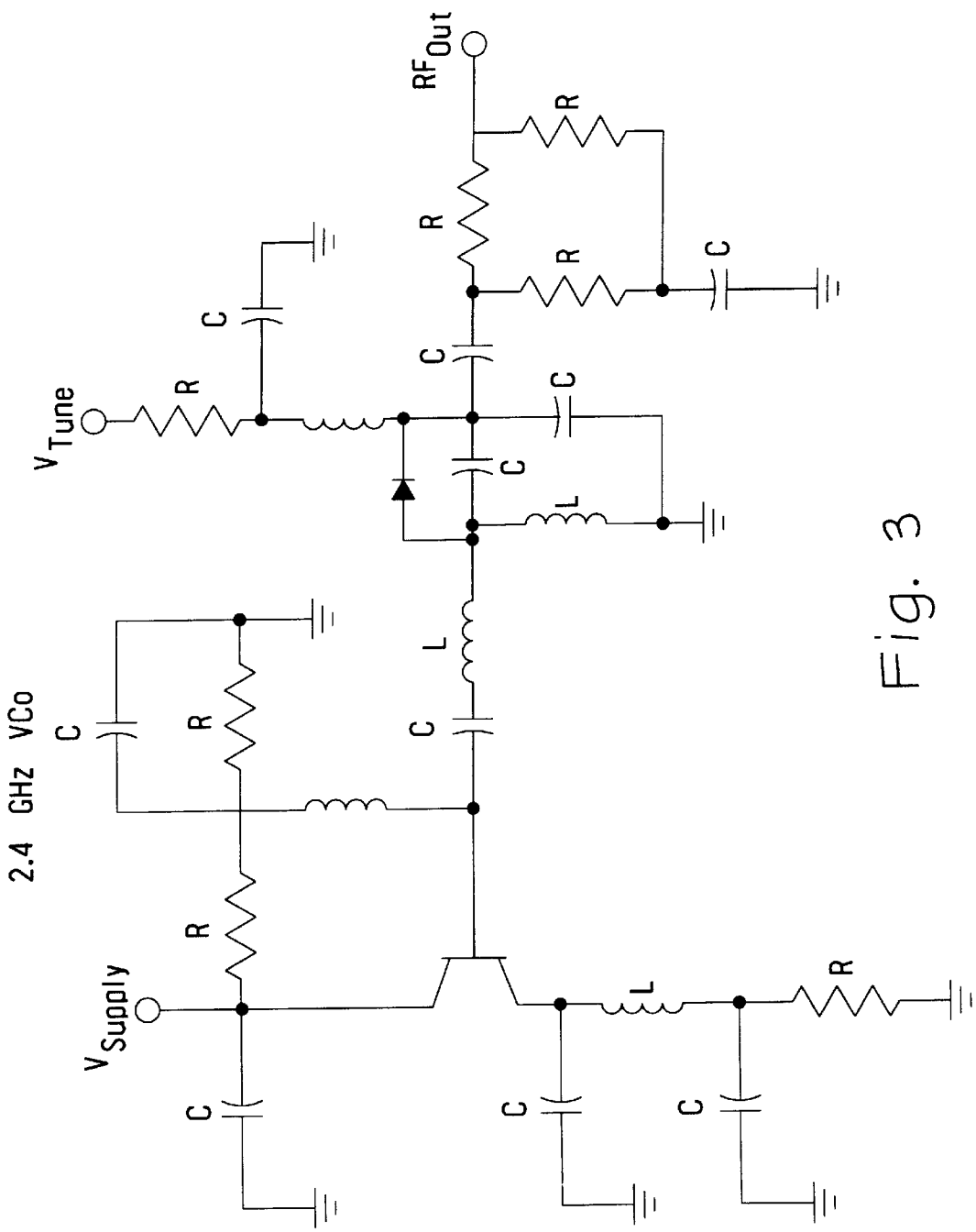
FIG. 3 is a circuit diagram of an exemplary VCO of the present invention.

Turning to FIG. 3, we see a circuit diagram for an exemplary voltage control oscillator envisioned by the present invention. The circuit used in the monolithic VCO design has a common collector configuration with the RF output taken off the base of the bipolar transistor. The resonator is also located in the base portion of the circuit, and the oscillation frequency is tuned by a silicon hypera-brupt tuning varactor.

Essentially the circuit is an amplifier with positive feedback, and any noise generated at the input of the amplifier can cause oscillation. The oscillation signal then builds until the amplifier reaches saturation. An L-C circuit is then used to set the frequency of the oscillation, and the varactor diode is used to tune that frequency. In the circuit diagram of the VCO, a capacitor at the emitter of the transistor is used to provide the positive feedback, and the resonator off the base is used to set the oscillation frequency.

Figure 1:
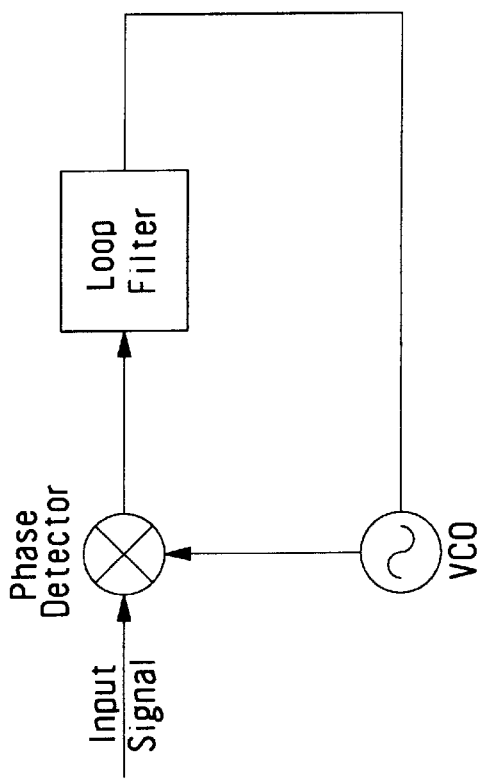
FIG. 1 is a block diagram of a phase lock loop.
Figure 2:
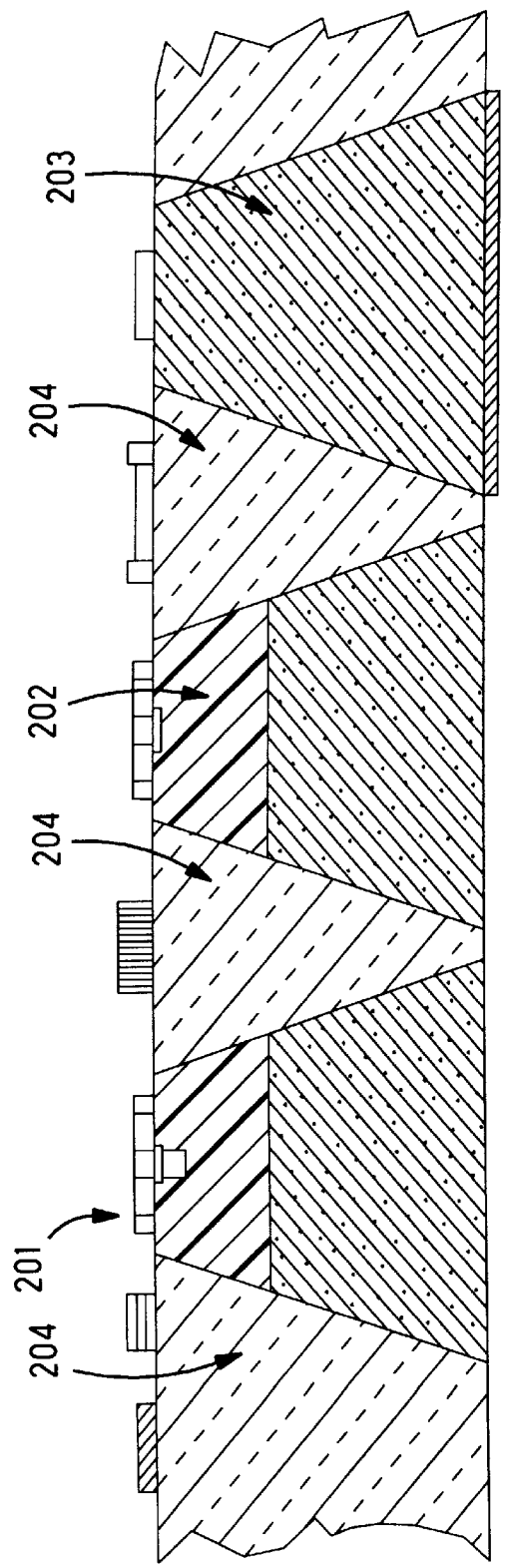
FIG. 2 is a cross sectional view of the varactor, bipolar junction transistor and vias of the present invention having selectively disposed passive circuit elements on the top surface and a selectively disposed ground planes on the lower surface.

FIG. 2 shows the cross sectional view of some of the essential elements of the heterolithic voltage controlled oscillator of the present invention. To this end, the hyper-abrupt tuning varactor 201 the transistor 202 and the ground via 203 are shown as pedestals. The fabrication of the present invention is as follows. A silicon wafer is obtained, and doped selectively and with a suitable donor dopant to a doping concentration to achieve a resistivity on the order of approximately 0.002–0.006 ohm/cm. Additionally, any required ground vias 203 are fabricated in this step. Thereafter, the bipolar junction transistor 202 as well as the hyper-abrupt tuning varactor 201 have disposed thereon an epitaxial layer of silicon epitaxially grown on the $n^+$ doped silicon substrate by standard technique. Finally, the p-doped regions of the varactor and transistor are fabricated through standard ion implantation techniques of suitable donor and acceptor ions.

After the basic fabrication of the various devices is completed, the pedestal structures of the devices and vias as shown in FIG. 2 are fabricated. To this end, the silicon wafer as well as the epitaxial materials grown thereon are of a preferred crystallographic orientation. Accordingly, anisotropic etching well known to one of ordinary skill in the art is performed in order to fabricate the pedestals as is shown in FIG. 2. To this end, etching techniques for example as disclosed in U.S. Pat. No. 4,210,923 to North et al., the disclosure of which is specifically incorporated herein by reference, as well as the above cited reference to Goodrich, et al. can be carried out. Thereafter, glass material, preferably corning 7070 is filled in the void between the silicon pedestals along side walls of the pedestals which are in preferred crystallographic planes. This material 204 is as stated preferably corning 7070 however, other materials which are dielectric and have a low loss at high frequencies are possible. It is of interest to note that the fabrication of the present invention can be modified for various applications. For example, the techniques to fabricate the heterolithic structure having the glass material between selectively disposed pedestals can be achieved through the techniques disclosed in U.S. the above-captioned U.S. Patent Application to Boles, et al., the disclosure of which is specifically incorporated herein by reference.

Finally, the required bond pads as well as passive devices to include capacitors, inductors, and resistors as is necessary to complete the VCO circuit are fabricated through standard metallization and dielectric growth techniques. Such techniques are well known to one of ordinary skill in the art.

The invention having been described in detail, it is clear that modifications of both process steps, circuits, and materials are possible. While it is clear that there are modifications and variations that are readily apparent to one of ordinary skill in the art, to the extent that such modifications and variations are within the theme and spirit of the present invention, a heterolithic silicon/glass based voltage controlled oscillator, these modifications and variations are deemed within the scope of the invention.

We claim:

1. A heterolithic voltage controlled oscillator comprising: a doped silicon wafer having a resistivity range of 0.002–0.006 Ohms/cm; the doped silicon wafer having applied thereon a ground via; the doped silicon wafer further being n$^+$ doped and having applied thereon epitaxially grown silicon of a preferred crystallographic orientation, the epitaxially grown silicon having p-doped regions fabricated of implanted donor and acceptor ions in the epitaxially grown silicon and providing a heterolithic varactor structure and a heterolithic bipolar transistor structure both having p-doped regions fabricated of implanted donor and acceptor ions in the epitaxially grown silicon; said epitaxially grown silicon having been anisotropically etched to provide respective pedestals embodying said varactor structure and said transistor structure and said ground via, a dielectric material disposed between said pedestals; and wherein; an input voltage ($V_{supply}$) is applied to a collector of the transistor structure, the transistor structure oscillates at a frequency proportional to said voltage, an L-C resonator circuit formed by metallization on the wafer connects at a base of the transistor structure, the varactor structure connects with an inductor formed by metallization on the wafer to provide a tank circuit, the tank circuit being connected to the resonator circuit, and the varactor structure having a capacitance that varies with voltage, which tunes the frequency of the resonator circuit to provide a voltage of different frequency that is applied as a tuning voltage $V_{tune}$ to the input voltage, and that shifts the average frequency of the voltage controlled oscillator towards the frequency of the input voltage.

2. A voltage controlled oscillator as recited in claim 1, wherein said dielectric material is glass.

3. A voltage controlled oscillator as recited in claim 1, wherein said dielectric material is a low loss material at microwave and rf frequencies.

* * * * *